(12) United States Patent
Yokoyama et al.

(10) Patent No.: US 11,610,766 B2
(45) Date of Patent: Mar. 21, 2023

(54) TARGET OBJECT PROCESSING METHOD AND PLASMA PROCESSING APPARATUS

(71) Applicant: TOKYO ELECTRON LIMITED, Tokyo (JP)

(72) Inventors: Seiji Yokoyama, Miyagi (JP); Taichi Okano, Miyagi (JP); Sho Oikawa, Miyagi (JP); Shunichi Kawasaki, Miyagi (JP); Toshifumi Nagaiwa, Hsin-chu (TW)

(73) Assignee: TOKYO ELECTRON LIMITED, Tokyo (JP)

( * ) Notice: Subject to any disclaimer, the term of this patent is extended or adjusted under 35 U.S.C. 154(b) by 629 days.

(21) Appl. No.: 16/674,401

(22) Filed: Nov. 5, 2019

(65) Prior Publication Data

US 2020/0144034 A1 May 7, 2020

(30) Foreign Application Priority Data

Nov. 5, 2018 (JP) .............................. JP2018-208028

(51) Int. Cl.
*H01J 37/32* (2006.01)
*H01J 37/34* (2006.01)
(Continued)

(52) U.S. Cl.
CPC .. *H01J 37/32577* (2013.01); *H01J 37/32642* (2013.01); *H01J 37/3435* (2013.01);
(Continued)

(58) Field of Classification Search
CPC ...... H01J 37/02; H01J 37/248; H01J 37/3053; H01J 37/32174; H01J 37/32577;
(Continued)

(56) References Cited

U.S. PATENT DOCUMENTS 8,759,227 B2 * 6/2014 Narishige ......... H01L 21/31116
438/719
2010/0081285 A1 4/2010 Chen et al.

FOREIGN PATENT DOCUMENTS

| JP | 2007-258417 | * 10/2007 |
| JP | 2011-60916 A | 3/2011 |
| WO | 2004-003988 A1 | 1/2004 |

OTHER PUBLICATIONS

Machine Translation JP 2007-258417 (Year: 2007).*

* cited by examiner

*Primary Examiner* — Rodney G McDonald
(74) *Attorney, Agent, or Firm* — Weihrouch IP

(57) ABSTRACT

A target object processing method is provided for processing a target object using a plasma processing apparatus including a processing chamber, a mounting table which is disposed in the processing chamber and on which the target object is mounted, an outer peripheral member disposed around the mounting table, and a first voltage application device configured to apply a voltage to the outer peripheral member. The method comprises preparing the target object having an etching target film and a patterned mask formed on the etching target film, and processing the mask. The step of processing the mask includes supplying a first processing gas containing a first rare gas to the processing chamber, and a first plasma processing for processing the mask positioned at an outer peripheral portion of the target object using plasma of the first processing gas while applying a DC voltage to the outer peripheral member.

16 Claims, 7 Drawing Sheets

(51) Int. Cl.
*H01L 21/311* (2006.01)
*H01L 21/02* (2006.01)

(52) U.S. Cl.
CPC .. *H01L 21/02123* (2013.01); *H01L 21/02266* (2013.01); *H01L 21/31116* (2013.01); *H01L 21/31138* (2013.01); *H01L 21/31144* (2013.01); *H01J 2237/3341* (2013.01)

(58) Field of Classification Search
CPC ........... H01J 37/32642; H01J 37/32715; H01J 37/3435; H01J 2237/3341; H01L 21/02123; H01L 21/02266; H01L 21/02315; H01L 21/0273; H01L 21/0274; H01L 21/3065; H01L 21/3116; H01L 21/31138; H01L 21/31144; H01L 21/32055; H01L 21/67069; H01L 21/67253; H01L 21/6831; H01L 21/68735
USPC .................................................. 204/192.32
See application file for complete search history.

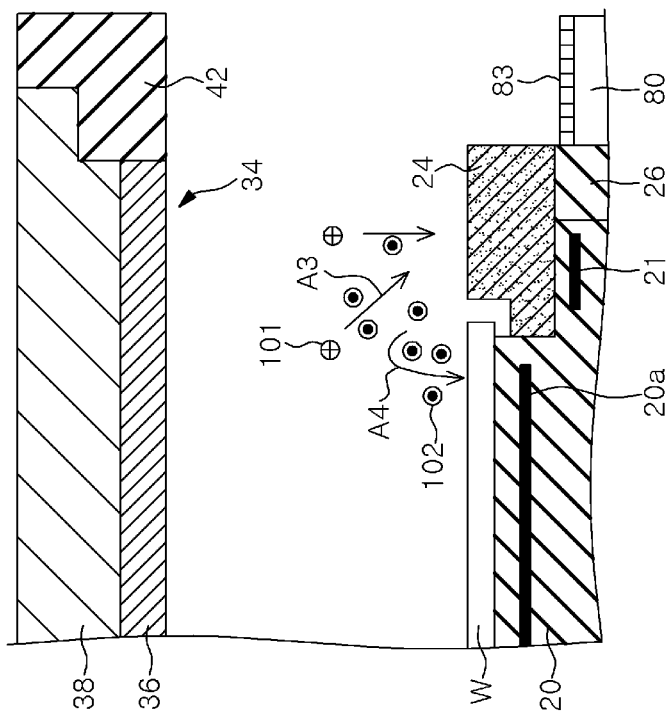
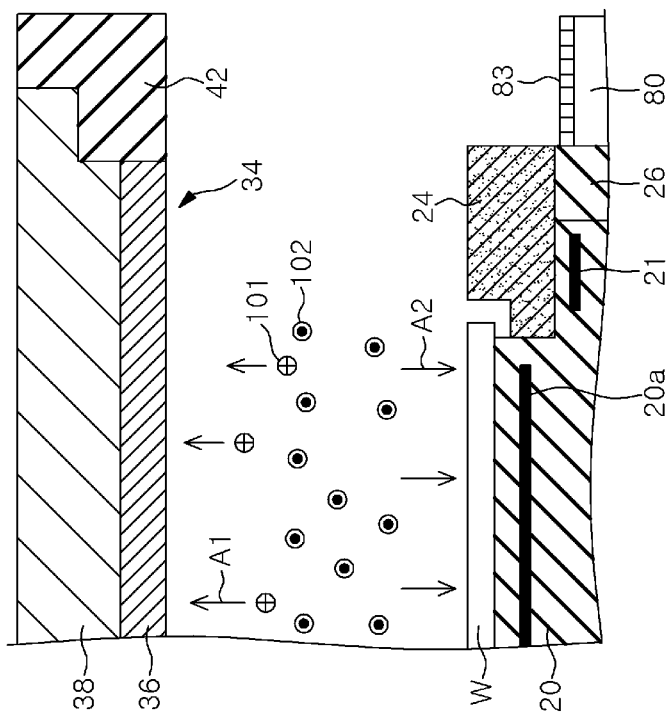

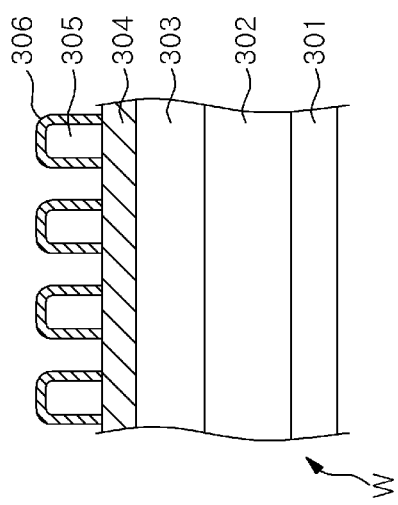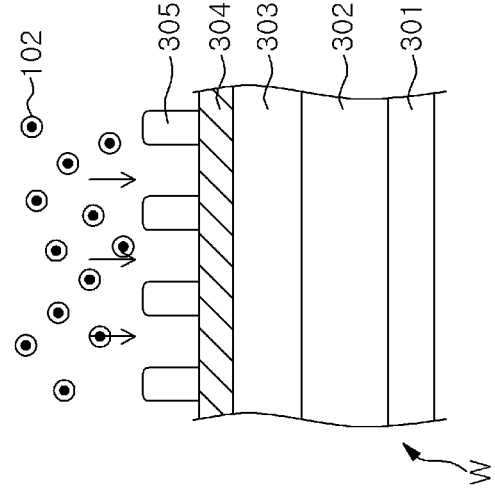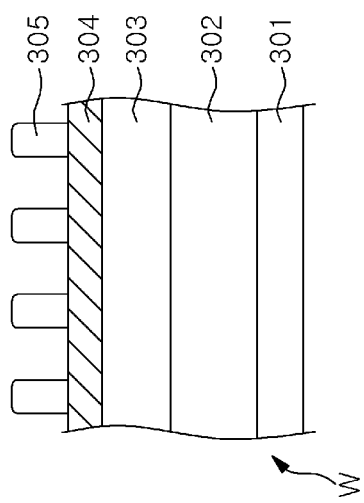

FIG. 4

| Position | | Center | Middle 75 mm | Edge 20mm | Edge 10mm | Edge 5 mm |
|---|---|---|---|---|---|---|
| UPPER ELECTRODE DC:-900 V | EDX Image | | | | | |
| EDGE RING DC:0 V | Top Deposition (nm) | 5.0 nm | 6.1 nm | 6.0 nm | 6.3 nm | 5.0 nm |
| | Side Deposition (nm) | 5.6 nm | 5.7 nm | 4.8 nm | 5.6 nm | 5.8 nm |
| UPPER ELECTRODE DC:0 V | EDX Image | | | | | |
| EDGE RING DC:-515 V | Top Deposition (nm) | 0 nm | 0 nm | 1.9 nm | 5.6 nm | 7.3 nm |
| | Side Deposition (nm) | 0 nm | 0 nm | 2.0 nm | 6.2 nm | 7.9 nm |
| UPPER ELECTRODE DC:-900 V | EDX Image | | | | | |
| EDGE RING DC:-515 V | Top Deposition (nm) | 6.0 nm | 6.2 nm | 7.3 nm | 8.1 nm | 9.6 nm |
| | Side Deposition (nm) | 9.0 nm | 8.9 nm | 8.8 nm | 9.4 nm | 9.2 nm |

TARGET OBJECT PROCESSING METHOD AND PLASMA PROCESSING APPARATUS

CROSS-REFERENCE TO RELATED APPLICATIONS

This application claims priority to Japanese Patent Application No. 2018-208028, filed on Nov. 5, 2018, the entire contents of which are incorporated herein by reference.

TECHNICAL FIELD

The present disclosure relates to a target object processing method and a plasma processing apparatus.

BACKGROUND

Japanese Patent Application Publication No. 2011-60916 discloses a target object processing method for etching an organic film using a photoresist layer as a mask while applying a DC negative voltage to a shower head.

The present disclosure provides a target object processing method and a plasma processing apparatus for processing a mask of the target object.

SUMMARY

In accordance with an aspect of the present disclosure, there is provided a target object processing method for processing a target object using a plasma processing apparatus including a processing chamber, a mounting table which is disposed in the processing chamber and on which the target object is mounted, an outer peripheral member disposed around the mounting table, and a first voltage application device configured to apply a voltage to the outer peripheral member, the method comprising: preparing the target object having an etching target film and a patterned mask formed on the etching target film; and processing the mask. The step of processing the mask includes: supplying a first processing gas containing a first rare gas to the processing chamber; and a first plasma processing for processing the mask positioned at an outer peripheral portion of the target object using plasma of the first processing gas while applying a DC voltage to the outer peripheral member.

BRIEF DESCRIPTION OF THE DRAWINGS

The objects and features of the present disclosure will become apparent from the following description of embodiments, given in conjunction with the accompanying drawings, in which:

FIGS. 2A and 2B show examples of movement of rare gas ions and sputtered silicon in the substrate processing apparatus according to the embodiment;

FIGS. 3A to 3C are schematic cross-sectional views showing an example of a configuration of a wafer that is a target object;

FIG. 4 is a table showing test results;

DETAILED DESCRIPTION

Figure 1:
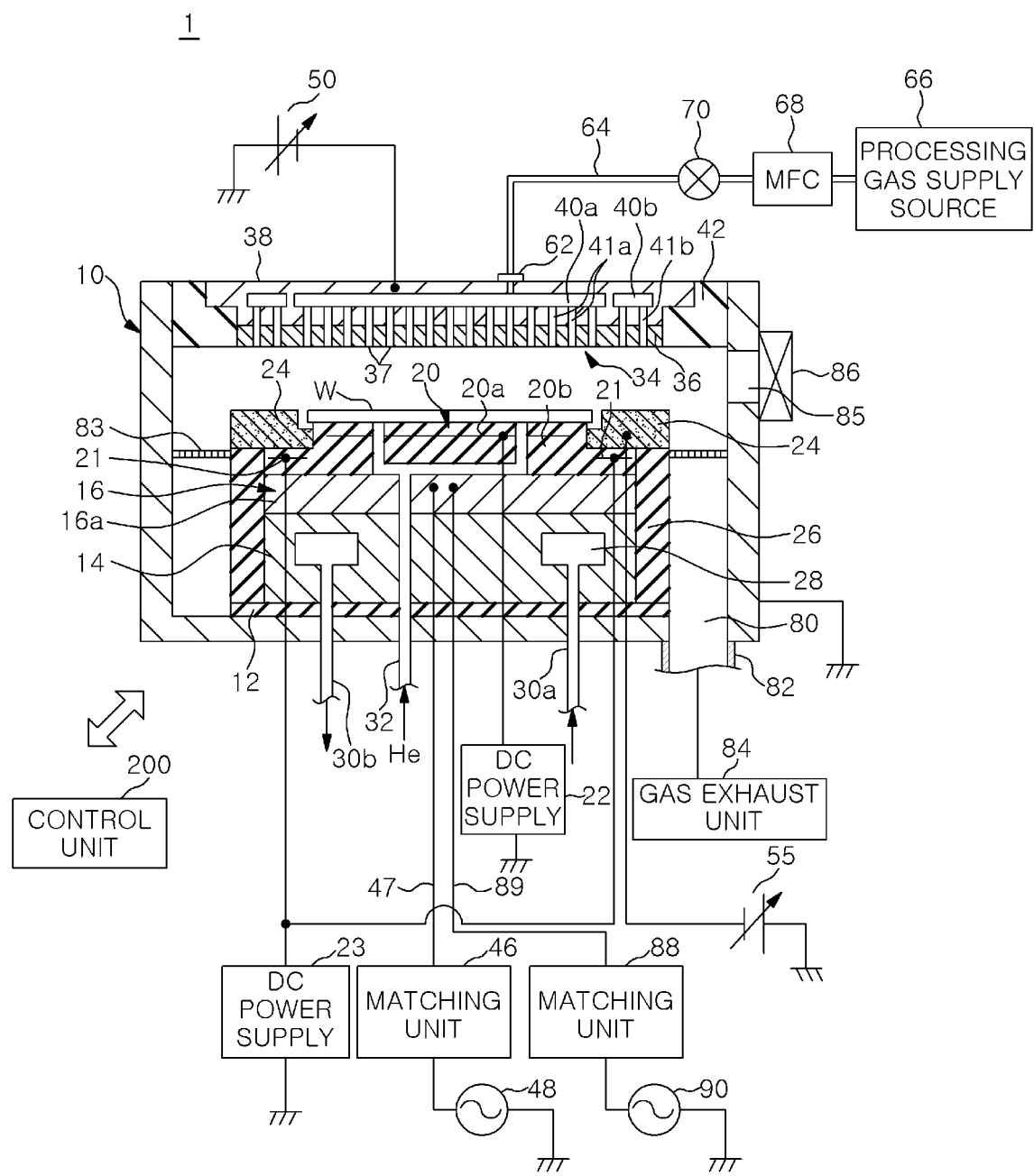
FIG. 1 shows an example of a substrate processing apparatus according to an embodiment.

Hereinafter, embodiments will be described in detail with reference to the accompanying drawings. Like reference numerals will be given to like or corresponding parts throughout the drawings, and redundant description thereof will be omitted.

<Substrate Processing Apparatus>

FIG. 1 shows an example of a substrate processing apparatus 1 according to an embodiment. A substrate processing apparatus 1 according to an embodiment is a capacitively coupled parallel plate type processing apparatus, and includes a cylindrical processing chamber 10 made of, e.g., aluminum having an anodically oxidized surface. The processing chamber 10 is grounded.

A cylindrical support 14 is disposed on a bottom portion of the processing chamber 10 with an insulating plate 12 made of ceramic or the like therebetween. A mounting table 16 made of, e.g., aluminum, is disposed on the support 14. The mounting table 16 includes an electrostatic chuck 20, a base 16a, an edge ring (outer peripheral member) 24, and an insulator ring 26. The electrostatic chuck 20 mounts thereon a wafer W that is an example of a substrate. The electrostatic chuck 20 has a structure in which a first electrode 20a made of a conductive film is embedded in an insulating layer 20b. A DC power supply 22 is connected to the first electrode 20a. The electrostatic chuck 20 may have a heater and a temperature of the electrostatic chuck 20 can be controlled.

A conductive edge ring 24 made of, e.g., silicon, is disposed around the wafer W. The edge ring 24 is also referred to as a focus ring. An annular insulator ring 26 made of, e.g., quartz, is disposed around the electrostatic chuck 20, the base 16a, and the support 14.

A second electrode 21 is embedded at a position of the electrostatic chuck 20 which faces the edge ring 24. A DC power supply 23 is connected to the second electrode 21. The DC power supply 22 and the DC power supply 23 individually apply DC voltages. An electrostatic force such as a Coulomb force or the like is generated at a central portion of the electrostatic chuck 20 by a voltage applied from the DC power supply 22 to the first electrode 20a. The wafer W is attracted and held on the electrostatic chuck 20 by the electrostatic force. An electrostatic force such as a Coulomb force or the like is generated at a peripheral portion of the electrostatic chuck 20 by a voltage applied from the DC power supply 23 to the second electrode 21. The edge ring 24 is attracted and held on the electrostatic chuck 20 by the electrostatic force.

A coolant chamber 28 is formed within the support 14 along a circumference of the support 14. A coolant, e.g., cooling water, having a predetermined temperature is supplied from a chiller unit provided at the outside into the coolant chamber 28 through pipelines 30a and 30b. The temperature of the wafer W on the mounting table 16 is controlled by the temperature of the coolant. Further, a heat transfer gas, e.g., He gas, from a heat transfer gas supply unit is supplied to a gap between the upper surface of the electrostatic chuck 20 and the backside of the wafer W through a gas supply line 32.

An upper electrode 34 is disposed above the mounting table 16 to face the mounting table 16. A space between the upper electrode 34 and the mounting table 16 serves as a plasma processing space.

The upper electrode 34 is supported at an upper portion of the processing chamber 10 through an insulating shielding member 42 and an opening between the upper electrode 34 and a ceiling portion of the processing chamber 10 is blocked. The upper electrode 34 includes an electrode plate 36 serving as a surface facing the mounting table 16 and having a plurality of gas injection holes 37, and an electrode holder 38 for detachably holding the electrode plate 36 and made of a conductive material, e.g., aluminum having an anodically oxidized surface. The electrode plate 36 is made of a silicon-containing material such as silicon, SiC, or the like. Gas diffusion spaces 40a and 40b are formed within the electrode holder 38. A plurality of gas through-holes 41a and 41b communicating with the gas injection holes 37 extends from the gas diffusion spaces 40a and 40b, respectively.

A gas inlet port 62 for introducing a gas to the gas diffusion spaces 40a and 40b is formed at the electrode holder 38. A gas supply line 64 is connected to the gas inlet port 62. A processing gas supply source 66 is connected to the gas supply line 64. A mass flow controller (MFC) 68 and an opening/closing valve 70 are disposed in that order from an upstream side of the gas supply line 64 where the processing gas supply source 66 is disposed. A processing gas is supplied from the processing gas supply source 66 through the gas supply line 64 and reaches the gas diffusion spaces 40a and 40b. Then, the processing gas passes through the gas through-holes 41a and 41b and is injected in a shower-like manner from the gas injection holes 37.

A first high frequency power supply 90 is connected to the mounting table 16 via a power feed rod 89 and a matching unit 88. The first high frequency power supply 90 applies a high frequency (HF) power to the mounting table 16. The matching unit 88 matches an inner impedance of the first high frequency power supply 90 with a load impedance. Accordingly, plasma is generated from a gas in the plasma processing space. The HF power may be supplied from the first high frequency power supply 90 to the upper electrode 34. When the HF power is applied to the mounting table 16, the HF power may have a frequency ranging from 13 MHz to 100 MHz, and the frequency may be, e.g., 40 MHz.

A second high frequency power supply 48 is connected to the mounting table 16 via a power feed rod 47 and a matching unit 46. The second high frequency power supply 48 applies a lower frequency (LF) power to the mounting table 16. The matching unit 46 matches an inner impedance of the second high frequency power supply 48 with the load impedance. Accordingly, ions are attracted to the wafer W on the mounting table 16. The second high frequency power supply 48 outputs a high frequency power having a frequency ranging from 400 kHz to 13.56 MHz. A filter for passing a power of a predetermined high frequency to the ground may be connected to the mounting table 16.

The frequency of the LF power is lower than that of the HF power. Voltage or currents of the LF power and the HF power may have a continuous waves or a pulsed wave. The shower head for supplying a gas serves as the upper electrode 34, and the mounting table 16 serves as the lower electrode.

A variable DC power supply 50 is connected to the upper electrode 34 to apply a DC voltage to the upper electrode 34. A variable DC power supply 55 is connected to the edge ring 24 to apply a DC voltage from the variable DC power supply 55 to the edge ring 24. The variable DC power supply 55 corresponds to a first voltage application device, and the variable DC power supply 50 corresponds to a second voltage application device.

Figure 7:
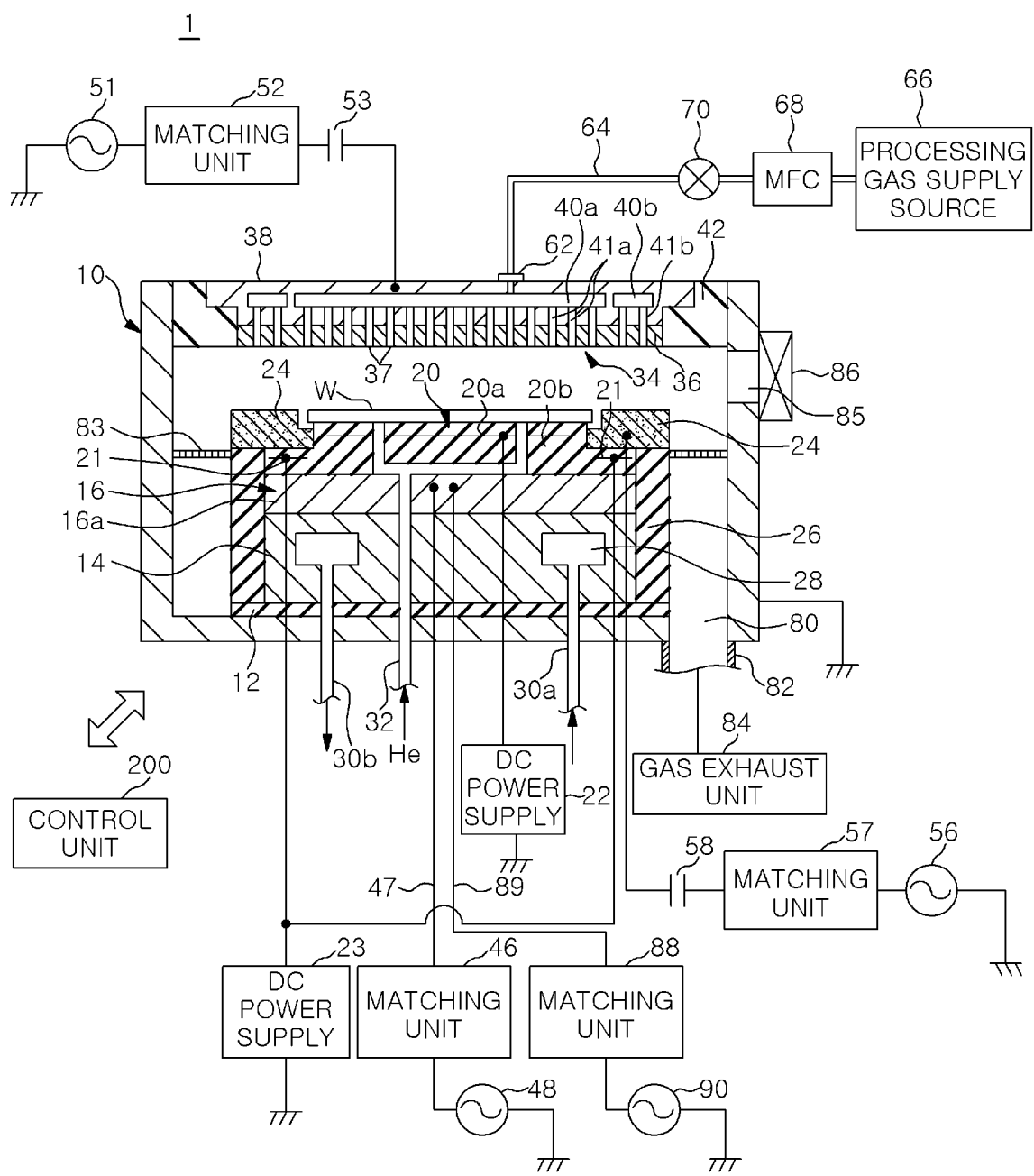
FIG. 7 shows an example of a substrate processing apparatus according to another embodiment.

FIG. 7 shows an example of the substrate processing apparatus 1 according to another embodiment. The substrate processing apparatus 1 shown in FIG. 7 is different from the substrate processing apparatus 1 shown in FIG. 1 in the configuration of the first voltage application device and the second voltage application device. The other configurations are the same as those of the substrate processing apparatus 1 shown in FIG. 1. Therefore, the redundant description thereof will be omitted.

As shown in FIG. 7, an AC power supply 51 may be connected to the upper electrode 34 via a matching unit 52 and a blocking capacitor 53, instead of the variable DC power supply 50. An AC power supply 56 may be connected to the edge ring 24 via a matching unit 57 and a blocking capacitor 58, instead of the variable DC power supply 55. In this case, the AC power supply 56 corresponds to the first voltage application device, and the AC power supply 51 corresponds to the second voltage application device.

The AC power supplies 51 and 56 output an AC power having a frequency f to which ions in the plasma can follow, i.e., an AC power having a high frequency or a low frequency which is lower than an ion plasma frequency. A power, a voltage peak value, or an effective value is variable.

When the AC power from the AC power supply 51 is applied to the upper electrode 34 via the blocking capacitor 53 during an etching process, a self-bias voltage $V_B$ is generated at the upper electrode 34. In other words, a negative DC voltage component is applied to the upper electrode 34, and a voltage (instantaneous value) of the AC power is superimposed on the negative DC voltage component. Similarly, when the AC power from the AC power supply 56 is applied to the edge ring 24 via the blocking capacitor 58, a negative DC voltage component is applied to the edge ring 24.

Here, since the frequency f of the AC power is lower than the ion plasma frequency $f_{pi}$ and an electron temperature of the edge ring 24 or near the upper electrode 34 is low, the self-bias voltage $V_B$ becomes close to the voltage peak value of the AC power. The potential of the upper electrode 34 or the edge ring 24 periodically changes because the voltage level (instantaneous value) of the AC power is superimposed on the self-bias voltage $V_B$.

Referring back to FIG. 1, a ring-shaped DC ground part (not shown) made of a conductive material, e.g., Si, SiC, or the like, is provided an appropriate position facing the processing space within the processing chamber 10, e.g., at a radially outer side of the upper electrode 34 or near the top of the insulator ring 26. This DC ground part is constantly grounded through a ground line (not shown). When a DC voltage is applied to the upper electrode 34 by the second voltage application device during plasma etching, a DC electron current flows between the upper electrode 34 and the DC ground part via the plasma. When a DC voltage is applied to the edge ring 24 by the first voltage application device, a DC electron current flows between the edge ring 24 and the DC ground part via the plasma.

A gas exhaust port 80 is disposed at the bottom portion of the processing chamber 10, and a gas exhaust unit 84 is connected to the gas exhaust port 80 through a gas exhaust line 82. The gas exhaust unit 84 has a vacuum pump such as a turbo molecular pump or the like, and decreases a pressure in the processing chamber 10 to a desired vacuum level. A loading/unloading port 85 for the wafer W is provided on a sidewall of the processing chamber 10. The loading/unloading port 85 can be opened and closed by a gate valve 86.

An annular baffle plate 83 is disposed between the annular insulator ring 26 and the sidewall of the processing chamber 10. The baffle plate 83 may be formed by coating an aluminum base with ceramic such as $Y_2O_3$ or the like.

In the case of performing predetermined processing such as etching process or the like in the substrate processing apparatus 1 configured as described above, first, the gate valve 86 is opened, and the wafer W is loaded into the processing chamber 10 through the loading/unloading port 85 and mounted on the mounting table. Then, a gas for the predetermined processing such as etching or the like is supplied at a predetermined flow rate from the processing gas supply source 66 to the gas diffusion spaces 40a and 40b, and then to the processing chamber 10 through the gas through-holes 41a and 41b and the gas injection holes 37. Then, the processing chamber 10 is evacuated by the exhaust unit 84. Accordingly, a pressure in the processing chamber 10 is controlled to a set value ranging from, e.g., 0.1 Pa to 150 Pa.

In a state where a predetermined gas is introduced into the processing chamber 10, the HF power is applied from the first high frequency power supply 90 to the mounting table 16. The LF power is applied from the second high frequency power supply 48 to the mounting table 16. A DC voltage is applied from the DC power supply 22 to the first electrode 20a, and the wafer W is held on the mounting table 16. A DC voltage is applied from the DC power supply 23 to the second electrode 21, and the edge ring 24 is held on the mounting table 16. A DC voltage may be applied from the variable DC power supply 50 to the upper electrode 34. A DC voltage may be applied from the variable DC power supply 55 to the mounting table 16.

The gas injected from the gas injection holes 37 of the upper electrode 34 is dissociated and ionized to generate plasma mainly by the HF power, and processing such as etching or the like is performed on a processing target surface of the wafer W by radicals or ions in the plasma. By applying the LF power to the mounting table 16, ions in the plasma are controlled and, thus, the processing such as etching or the like is facilitated.

The substrate processing apparatus 1 includes a control unit 200 for controlling the overall operation of the apparatus. A CPU of the control unit 200 performs desired plasma processing such as etching or the like based on a recipe stored in a memory such as a ROM, a RAM, or the like. The recipe may include a processing time, a pressure (gas exhaust), an HF power, an LF power, which are the information for controlling the apparatus depending on processing conditions, or may include a voltage, various gas flow rates, and the like. The recipe may also include a temperature in the processing chamber (temperatures of the upper electrode, the sidewall of the processing chamber, the wafer W, the electrostatic chuck, and the like), a temperature of the coolant supplied from the chiller, or the like. The recipe indicating these programs or processing conditions may be stored in a hard disk or a semiconductor memory. Further, the recipe may be set to a predetermined position while being stored in a portable computer-readable storage medium such as a CD-ROM, a DVD, or the like, and may be read-out therefrom.

Next, a photoresist layer modification process will be described with reference to FIGS. 2A and 2B and 3A to 3C. FIGS. 2A and 2B show examples of movement of rare gas ions and sputtered silicon in the substrate processing apparatus 1 according to the embodiment. FIG. 2A shows a case where a DC negative voltage is applied to the upper electrode 34. FIG. 2B shows a case where a DC negative voltage is applied to the edge ring 24.

In the photoresist layer modification process, a processing gas containing a rare gas is supplied from the processing gas supply source 66 to the plasma processing space. The rare gas may be, e.g., argon, helium, krypton, xenon, or the like. The processing gas may contain only a rare gas. Alternatively, the processing gas may be a mixed gas of a gas containing hydrogen and a rare gas. The gas containing hydrogen may be, e.g., $H_2$, $CH_4$, $CH_3F$, HBr, or the like. In the following description, a case where the processing gas is a mixed gas of $H_2$ and Ar will be described as an example.

$H_2$ gas and Ar gas supplied to the plasma processing space are dissociated and ionized to generate plasma mainly by the HF power. The plasma contains hydrogen radicals (H*) and argon ions ($Ar^+$).

Here, as shown in FIG. 2A, when a DC negative voltage is applied to the upper electrode 34 in a state where no voltage is applied to the edge ring 24, argon ions 101 are moved toward the upper electrode 34 made of silicon or SiC as indicated by arrows A1 and collide with the upper electrode 34. Accordingly, silicons of the upper electrode 34 are sputtered and released to the plasma processing space. At the same time, electrons are released to the plasma processing space. The silicons 102 are moved downward as indicated by arrows A2. Accordingly, the silicons 102 are deposited on the wafer W. Here, the upper electrode 34 is disposed to cover the entire wafer W. The silicons 102 are moved downward from the upper electrode 34 toward the wafer W while being diffused in the plasma processing space. Therefore, the silicons 102 are deposited on the entire wafer W (the central portion and the outer peripheral portion of the wafer W).

As shown in FIG. 2B, when a DC negative voltage is applied to the edge ring 24 in a state where no voltage is applied to the upper electrode 34, the argon ions 101 are moved toward the edge ring 24 made of silicon or SiC as indicated by arrows A3 and collide with the edge ring 24. Accordingly, silicons of the edge ring 24 are sputtered and are released to the plasma processing space. At the same time, electrons are released to the plasma processing space. The silicons 102 are moved downward as indicated by arrows A4. Therefore, the silicons 102 are deposited on the wafer W. Here, the edge ring 24 is disposed near the side surface of the wafer W, and the silicons 102 sputtered from the edge ring 24 are locally deposited near the side surface of the wafer W. Further, the edge ring 24 is disposed below the plasma processing space. Hence, a distance of downward movement of the silicons 102 released to the plasma processing space is short, and the diffusion thereof is suppressed. Accordingly, the silicons 102 are deposited on the outer peripheral portion of the wafer W.

As an absolute value of the DC negative voltage applied to the upper electrode 34 increases, collision energy of the argon ions 101 colliding with the upper electrode 34 increases. Thus, the amount of silicons 102 released to the plasma processing space by the sputtering increases, and the amount of the silicons 102 deposited on the entire wafer W increases.

Further, as the absolute value of the DC negative voltage applied to the edge ring 24 increases, the collision energy of the argon ions 101 colliding with the edge ring 24 increases. Therefore, the amount of the silicons 102 released to the plasma processing space by the sputtering increases, and the amount of the silicons deposited locally on the wafer W increases.

The distribution of the silicons 102 deposited on the wafer W can be controlled by controlling the variable DC power supplies 50 and 55 to control the DC negative voltages applied to the upper electrode 34 and the edge ring 24.

FIGS. 3A to 3C are schematic cross-sectional views showing an example of a configuration of the wafer W that is a target object.

As shown in FIG. 3A, a wafer W that is a target object has a silicon substrate 301, a silicon oxide layer 302, a spin-on-carbon layer 303, an anti-reflection layer 304, and a photoresist layer 305 sequentially stacked in that order from the bottom. Here, the photoresist layer 305 is a patterned mask made of, e.g., an organic film. The anti-reflection layer 304 is a film to be etched via the photoresist layer 305 serving as the mask.

As shown in FIGS. 2A and 2B, the silicons are sputtered from the upper electrode 34 and the edge ring 24 by the argon ions, and the silicons 102 are released to the plasma processing space. At the same time, electrons are released to the plasma processing space. Accordingly, the silicons 102 are deposited on the wafer W as shown in FIG. 3B.

As shown in FIG. 3C, the deposited silicons react with the photoresist layer 305 that is an organic film, thereby forming a silicon layer 306 made of a silicon compound on the surface of the photoresist layer 305. The silicon compound forming the silicon layer 306 is, e.g., SiC. Alternatively, silicons are directly deposited on the surface of the photoresist layer 305, thereby forming the silicon layer 306. When the electrons released to the plasma processing space are irradiated onto the photoresist layer 305, reaction such as crosslinking or the like occurs. Thus, the photoresist layer 305 is modified and hardened. When hydrogen radicals react with the photoresist layer 305, the photoresist layer 305 is modified and hardened. Accordingly, it is possible to etch the anti-reflection layer 304 that is an etching target film, the spin-on carbon layer 303, and the silicon oxide layer 302 in that order while suppressing a decrease in the height of the photoresist layer 305.

In accordance with the substrate processing apparatus 1 of the present embodiment, the photoresist layer 305 can be modified. The distribution of the silicons 102 deposited on the wafer W can be controlled by controlling the variable DC power supplies 50 and 55 to control the DC negative voltages applied to the upper electrode 34 and the edge ring 24. Therefore, the in-plane uniformity of the modification of the photoresist layer 305 can be improved by controlling, e.g., the DC negative voltages applied to the upper electrode 34 and the edge ring 24. Further, the photoresist layer 305 can be locally modified by applying a DC negative voltage only to the edge ring 24 to deposit the silicons 102 only at the vicinity of the edge of the wafer W which is the vicinity of the edge ring 24.

Further, in accordance with the substrate processing apparatus 1 of the present embodiment, the anti-reflection film 304 that is an etching target film can be etched while using as a mask the photoresist layer 305 on which the silicon layer 306 is formed and/or the modified photoresist layer 305. When the anti-reflection film 304 is etched, the silicon layer 306 on the photoresist layer 305 or the modified layer may be removed by etching. In this case, it is preferable to modify the photoresist layer again and continue the etching of the anti-reflection film 304. The number of repetitions of the modification process and etching may be set in advance.

Here, tests were conducted under the following processing conditions (1) to (3) to evaluate the modification of the photoresist layer 305 due to the application of DC negative voltages to the upper electrode 34 and the edge ring 24.

In the processing condition (1), the DC negative voltage is applied only to the upper electrode 34.

Pressure in the processing chamber: 50 mT
Processing gas: $H_2$ gas+Ar gas
Processing gas flow rate: $H_2$/Ar=100 sccm/800 sccm
HF power: 40 MHz 300 W
DC voltage applied to the upper electrode: −900 V
DC voltage applied to the edge ring: 0 V
Processing time: 60 sec In the processing condition (2), the DC negative voltage is applied only to the edge ring 24.

Pressure in the processing chamber: 50 mT
Processing gas: $H_2$ gas+Ar gas
Processing gas flow rate: $H_2$/Ar=100 sccm/800 sccm
HF power: 40 MHz 300 W
DC voltage applied to the upper electrode: 0 V
DC voltage applied to the edge ring: −515 V
Processing time: 60 sec In the processing condition (3), the DC negative voltage is applied to the upper electrode 34 and the edge ring 24.

Pressure in the processing chamber: 50 mT
Processing gas: $H_2$ gas+Ar gas
Processing gas flow rate: $H_2$/Ar=100 sccm/800 sccm
HF power: 40 MHz 300 W
DC voltage applied to the upper electrode: −900 V
DC voltage applied to the edge ring: −515 V
Processing time: 60 sec Measurement was performed at five points on a wafer W having a diameter of 300. The five points include the center of the wafer W (Center), a point 75 mm away from the edge of the wafer W (Middle 75 mm), a point 20 mm away from the edge of the wafer W (Edge 20 mm), a point 10 mm away from the edge of the wafer W (Edge 10 mm), and a point 5 mm away from the edge of the wafer W (Edge 5 mm).

Figure 5:
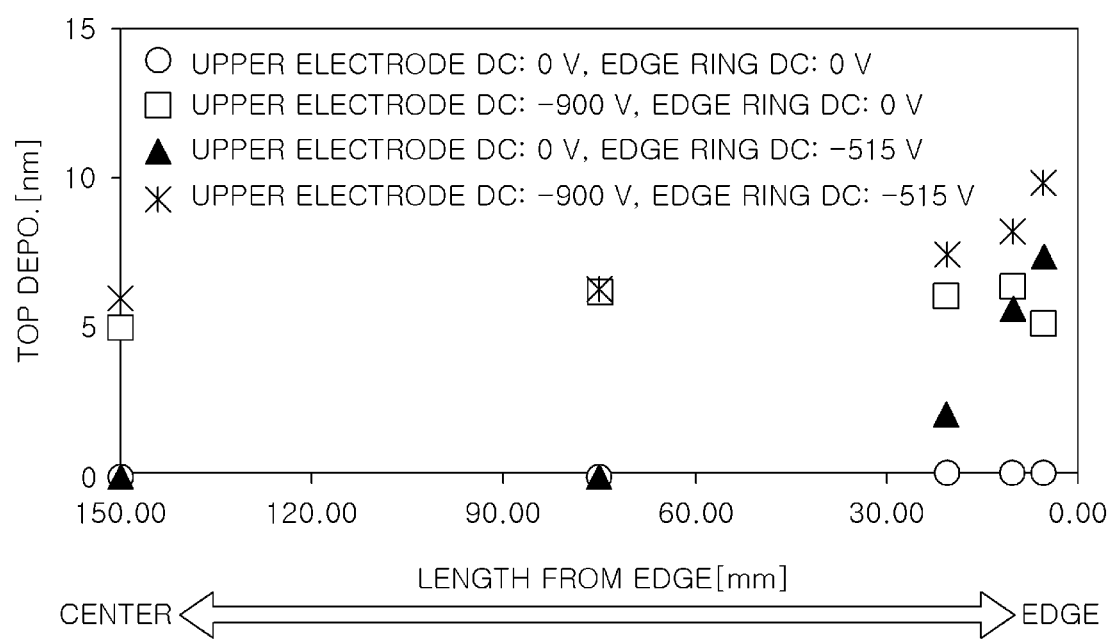
FIG. 5 is a graph showing the amount of deposition of silicon on an upper surface of a photoresist layer.

The test results are shown in FIGS. 4 and 5. FIG. 4 is a table showing the test results. In FIG. 4, energy dispersive X-ray spectrometry (EDX) images display silicon in the film. Here, the silicon-containing anti-reflection layer 304 and the silicon layer 306 deposited on the photoresist layer 305 are displayed on the images. In FIG. 4, the boundary between the anti-reflection layer 304 and the silicon layer 306 is clearly shown. "Top Deposition" indicates the amount of silicon deposited on the upper surface of the photoresist layer 305. "Side Deposition" indicates the amount of silicon deposited on the side surface of the photoresist layer 305.

FIG. 5 is a graph showing the amount of silicon deposited on the upper surface of the photoresist layer 305. FIG. 5 shows a case where no DC negative voltage is applied to the upper electrode 34 and the edge ring 24 in addition to the processing conditions (1) to (3).

As shown in FIGS. 4 and 5, in the processing condition (1) in which the DC negative voltage is applied only to the upper electrode 34, the amount of silicon deposited on the upper surface of the photoresist layer 305 was uniform from "Center" to "Edge 20 mm" (the central portion of the wafer W). On the other hand, it is confirmed that the amount of silicon deposited on the upper surface of the photoresist layer 305 decreased between "Edge 20 mm" and "Edge 5 mm" (near the edge of the wafer W).

In the processing condition (3) in which the DC negative voltage is applied to the upper electrode 34 and the edge ring 24, the amount of silicon deposited on the upper surface of the photoresist layer 305 was uniform at the central portion of the wafer W. Further, it is confirmed that the amount of silicon deposited on the upper surface of the photoresist layer 305 increased near the edge of the wafer W.

From the above, it is clear that the amount of silicon deposited near the edge portion of the wafer W can be increased while maintaining the uniformity of the silicon deposition amount on the central portion of the wafer W by applying the DC negative voltages to the edge ring 24 and the upper electrode 34. Accordingly, it is possible to improve the uniformity of the silicon deposition amount on the entire wafer W, i.e., the controllability of the distribution of the silicon deposition amount in the surface of the wafer W.

As shown in FIG. 4, the uniformity of the silicon deposition amount on the side surface of the photoresist layer 305 was improved in the processing condition (3) in which the DC negative voltage is applied to the upper electrode 34 and the edge ring 24, compared to the processing condition (1) in which the DC negative voltage is applied only to the upper electrode 34.

Further, it is confirmed that the amount of silicon deposited near the edge of the wafer W can be controlled by the processing condition (2) in which the DC negative voltage is applied only to the edge ring 24. Therefore, it is possible to improve the controllability of the silicon deposition amount at the central portion and the outer peripheral portion of the wafer W by controlling the balance between the DC voltage applied to the upper electrode 34 and the DC voltage applied to the edge ring 24.

In the processing condition (3), the DC negative voltage is applied to both of the upper electrode 34 and the edge ring 24. However, the present disclosure is not limited thereto. For example, it is possible to apply a DC negative voltage to the upper electrode 34 (the processing condition (1)) and then to the edge ring 24 (the processing condition (2)). In this case as well, the controllability of the distribution of the silicon deposition amount in the surface of the wafer W can be improved.

The processing condition (1) and the processing condition (2) may be repeated multiple times. The number of repetitions may be set in advance. In this case as well, the controllability of the distribution of the silicon deposition amount in the surface of the wafer W can be improved.

In the test results shown in FIGS. 4 and 5, parameters other than the DC voltages applied to the upper electrode and the edge ring are the same. However, the parameters other than the DC voltages are not necessarily the same in the case of applying the processing conditions (1) and (2) consecutively. By controlling the parameters such as types or flow rates of processing gases, a pressure, an HF power, and the like depending on the processing conditions (1) and (2), it is possible to further improve the controllability of the distribution of the silicon deposition amount at the central portion and the outer peripheral portion of the wafer W.

For example, in the case of applying the processing conditions (1) and (2) consecutively, the processing gas of the processing condition (1) and the processing gas of the processing condition (2) may be the same. In this case, since it is not necessary to change the processing gases, the configuration of the substrate processing apparatus 1 can be simplified.

Further, in the case of applying the processing conditions (1) and (2) consecutively, the processing gas of the processing condition (1) and the processing gas of the processing condition (2) may be different. In this case, the controllability of the distribution of the silicon deposition amount in the surface of the wafer W can be further improved by changing the processing gases.

Figure 6:
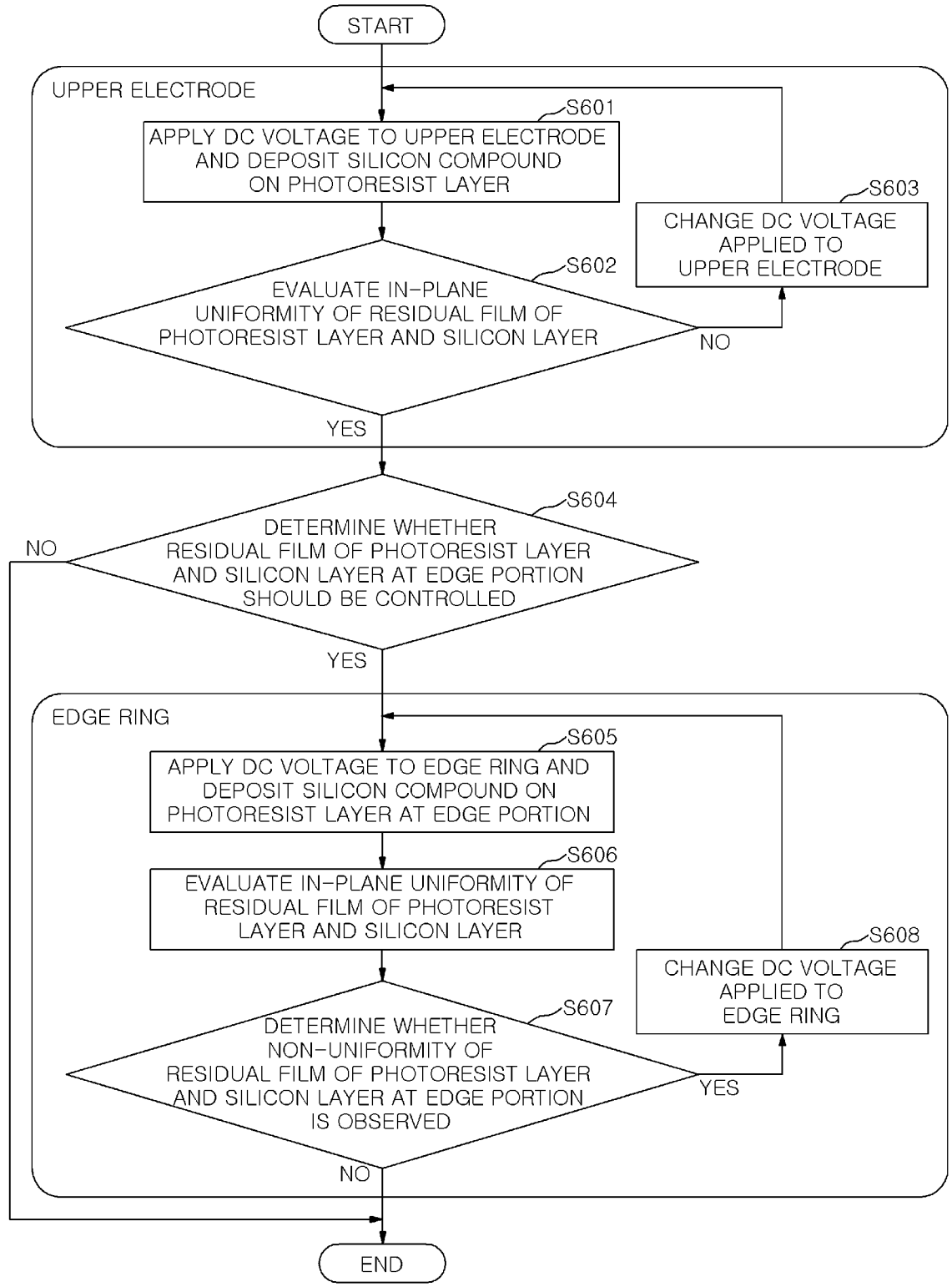
FIG. 6 is a flowchart for explaining an example of a method for determining voltages to be applied to an upper electrode and an edge ring.

FIG. 6 is a flowchart for explaining an example of a method for determining voltages to be applied to the upper electrode 34 and the edge ring 24. In FIG. 6, a case where the in-plane uniformity is improved will be described as an example.

In step S601, a negative DC voltage is applied to the upper electrode 34, and the wafer W is processed by the substrate processing apparatus 1 to deposit a silicon compound on the photoresist layer 305.

In step S602, the in-plane uniformity of a residual film of the photoresist layer 305 and the silicon layer 306 are evaluated. For example, the in-plane uniformity at the central portion of the wafer W is evaluated by capturing EDX images. When the in-plane uniformity satisfies a predetermined condition (YES in step S602), the processing proceeds to step S604. Otherwise (NO in step S602), the processing proceeds to step S603.

In step S603, the DC negative voltage applied to the upper electrode 34 is changed. Then, the processing returns to step S601, and a silicon compound is deposited on the photoresist layer 305 by applying the changed DC negative voltage.

In step S604, it is determined whether or not the residual film of the photoresist layer 305 and the silicon layer 306 should be controlled at the edge portion of the wafer W. If the control at the edge portion is required (YES in step S604), the processing proceeds to step S605. If the control at the edge portion is not required (NO in step S604), the processing is terminated.

In step S605, a negative DC voltage is applied to the edge ring 24, and the wafer W is processed by the substrate processing apparatus 1 to deposit a silicon compound on the photoresist layer 305.

In step S606, the in-plane uniformity of the residual film of the photoresist layer 305 and the silicon layer 306 are evaluated. For example, the in-plane uniformity thereof at the central portion of the wafer W is evaluated.

In step S607, the non-uniformity of the residual film of the photoresist layer 305 and the silicon layer 306 at the edge portion (outer peripheral portion) of the wafer W is evaluated by capturing, e.g., EDX images. If the non-uniformity is observed at the edge portion (YES in step S607), the processing proceeds to step S608. If the non-uniformity is not observed at the edge portion, the processing is terminated.

In step S608, the DC negative voltage applied to the edge ring 24 is changed. Then, the processing returns to step S605, and a silicon compound is deposited on the photoresist layer 305 by applying the changed DC negative voltage.

In this manner, the DC negative voltages applied to the upper electrode 34 and the edge ring 24 can be determined. In the example shown in FIG. 6, the in-plane uniformity has been described as an example. However, the present disclosure is not limited thereto. It is also possible to set desired distribution of the residual film of the photoresist layer 305 and the silicon layer 306 and determine DC negative voltages to be applied to the upper electrode 34 and the edge ring 24 to obtain the desired distribution.

For example, when it is desired to deposit silicon on the outer peripheral portion of the wafer W, the voltage may be applied only to the edge ring 24. In this case, the voltage to be applied to the edge ring 24 can be determined by performing step S605 and subsequent steps of FIG. 6.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A target object processing method for processing a target object using a plasma processing apparatus including a processing chamber, a mounting table which is disposed in the processing chamber and on which the target object is mounted, an outer peripheral member disposed around the mounting table, and a first voltage application device configured to apply a voltage to the outer peripheral member, the method comprising:
preparing the target object having an etching target film and a patterned mask formed on the etching target film; and
processing the mask,
wherein said processing the mask includes:
supplying a first processing gas containing a first rare gas to the processing chamber; and
a first plasma processing for processing the mask positioned at an outer peripheral portion of the target object using plasma of the first processing gas while applying a DC voltage to the outer peripheral member, wherein in the first plasma processing, silicon sputtered from the outer peripheral member by the first rare gas is deposited on the mask positioned at the outer peripheral portion of the target object.

2. The target object processing method of claim 1, wherein the plasma processing apparatus further includes an upper electrode disposed to face the mounting table, and a second voltage application device configured to apply a voltage to the upper electrode, and
said processing the mask further includes:
applying a second processing gas containing a second rare gas to the processing chamber; and
a second plasma processing for processing the mask positioned at a central portion and the outer peripheral portion of the target object using plasma of the second processing gas while applying a DC voltage to the upper electrode.

3. The target object processing method of claim 2, wherein in the second processing, silicon sputtered from the upper electrode by the second rare gas is deposited on the central portion and the outer peripheral portion of the target object.

4. The target object processing method of claim 2, wherein in said processing the mask, the first processing gas and the second processing gas are the same, and the first plasma processing and the second plasma processing are performed simultaneously.

5. The target object processing method of claim 2, wherein in said processing the mask, the second plasma processing is performed and then the first plasma processing is performed.

6. The target object processing method of claim 5, wherein the first processing gas and the second processing gas are the same.

7. The target object processing method of claim 5, wherein the first processing gas and the second processing gas are different.

8. The target object processing method of claim 5, wherein the second plasma processing and the first plasma processing are repeated a predetermined number of times that is once or more.

9. The target object processing method of claim 1, further comprising, after said processing the mask:
etching the etching target film,
wherein said etching includes:
supplying a third processing gas to the processing chamber; and
etching the etching target film by plasma of the third processing gas.

10. The target object processing method of claim 9, wherein said processing the mask and said etching are repeated a predetermined number of times that is once or more.

11. The target object processing method of claim 1, wherein the mask is an organic film.

12. The target object processing method of claim 2, wherein the mask is an organic film, and
the first processing gas and the second processing gas are a mixed gas of a hydrogen-containing gas and a rare gas.

13. The target object processing method of claim 12, wherein the hydrogen-containing gas includes at least one of $H_2$, $CH_4$, $CH_3F$, and HBr.

14. The target object processing method of claim 1, wherein the first voltage application device is a first DC power supply connected to the outer peripheral member or a first AC power supply connected to the outer peripheral member via a blocking capacitor.

15. The target object processing method of claim 2, wherein the second voltage application device is a second DC power supply connected to the upper electrode or a second AC power supply connected to the upper electrode via a blocking capacitor.

16. A plasma processing apparatus comprising:
a processing chamber in which plasma processing is performed on a target object;
a mounting table which is disposed in the processing chamber and on which the target object is mounted;
an outer peripheral member disposed around the mounting table;
a first voltage application device configured to apply a voltage to the outer peripheral member; and
a control unit,
wherein the control unit controls:
preparing the target object having an etching target film and a patterned mask formed on the etching target film;
supplying a processing gas containing a rare gas to the processing chamber; and
processing the mask positioned at an outer peripheral portion of the target object using plasma of the processing gas while applying a DC voltage to the outer peripheral member, wherein silicon sputtered from the outer peripheral member by the first rare gas is deposited on the mask positioned at the outer peripheral portion of the target object.

* * * * *